(12) United States Patent
Heyne et al.

(10) Patent No.: US 6,307,416 B1
(45) Date of Patent: Oct. 23, 2001

(54) INTEGRATED CIRCUIT FOR PRODUCING TWO OUTPUT CLOCK SIGNALS AT LEVELS WHICH DO NOT OVERLAP IN TIME

(75) Inventors: Patrick Heyne, Müchen; Thoralf Graëtz, Dresden; Dieter Härle, Munich, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/519,541

(22) Filed: Mar. 6, 2000

(30) Foreign Application Priority Data

Mar. 4, 1999 (DE) .............................. 199 09 536

(51) Int. Cl.⁷ .................................................. H03H 11/16
(52) U.S. Cl. ........................................ 327/259; 327/239

(58) Field of Search .................................. 327/239, 259, 327/296, 251, 253, 257, 258

(56) References Cited

U.S. PATENT DOCUMENTS 5,173,618 * 12/1992 Eisenstadt ............................. 327/239
5,874,845 * 2/1999 Hynes .................................. 327/259

FOREIGN PATENT DOCUMENTS 2186455A 8/1987 (GB) .

* cited by examiner

Primary Examiner—Toan Tran
Assistant Examiner—Cassandra Cox
(74) Attorney, Agent, or Firm—Herbert L. Lerner; Laurence A. Greenberg; Werner H. Stemer

(57) ABSTRACT

The integrated circuit has two inputs each supplying one input clock. Two outputs each output one output clock. The first logic levels of the output clock signals at the outputs do not overlap in time.

7 Claims, 4 Drawing Sheets

INTEGRATED CIRCUIT FOR PRODUCING TWO OUTPUT CLOCK SIGNALS AT LEVELS WHICH DO NOT OVERLAP IN TIME

BACKGROUND OF THE INVENTION

FIELD OF THE INVENTION

The invention relates to an integrated circuit for producing two output clock signals, in which first logic levels of the output clock signals do not overlap in time.

Such circuits are required, for example, for actuating shift registers, in which a plurality of register elements are arranged in a series circuit, and are connected to one another via switching elements. It is thereby important that the switching element on the input side and the switching element on the output side of one of the register elements are not both switched on at any time. It is thus advantageous for the two switching elements each to be actuated by different clocks, the switching element being switched on at a first clock signal logic level, and being switched off at the other logic level. In order to avoid both switching elements from being switched on at the same time, it is essential that the first logic levels of the two clock signals do not overlap in time.

SUMMARY OF THE INVENTION

The object of the invention is to provide an integrated circuit for producing two output clock signals which overcomes the above-noted deficiencies and disadvantages of the prior art devices and methods of this kind, and which provides for first logic levels which do not overlap in time. Furthermore, the time interval during which neither of the output clock signals is at the first logic level should be as short as possible.

With the above and other objects in view there is provided, in accordance with the invention, an integrated circuit, comprising:

a first input and a second input each supplying one input clock;

a first output outputting a first output clock signal and a second output outputting a second output clock signal, the output clock signals having first logic levels that do not overlap in time;

a first and a second inverter connected back to back and between the first and second outputs;

a first series circuit comprising a first switching element having a control connection connected to the first input and a second switching element having a control connection, the first series circuit connecting the first output to a supply potential;

a second series circuit comprising a third switching element having a control connection connected to the second input and a fourth switching element having a control connection, the second series circuit connecting the second output to the supply potential;

a first circuit unit connected to the control connection of the second switching element, the first circuit unit, during an operation of the circuit, supplying the second switching element with a signal derived from the input clock supplied to the first input; and a second circuit unit connected to the control connection of the fourth switching element, the second circuit unit, during an operation of the circuit, supplying the second switching element with a signal derived from the input clock supplied to the second input.

The invention allows the generation of the two output clock signals, whose first logic levels do not overlap in time, from two input clocks whose logic levels may overlap in any way in time.

In accordance with an added feature of the invention, a third and a fourth inverter are connected back to back (anti-parallel) and between the control connections of the second and the fourth switching element; and further, the first circuit unit has a third series circuit comprising a fifth switching element with a control connection connected to the second output and a sixth switching element with a control connection, the third series circuit connecting the control connection of the second switching element to the supply potential;

the second circuit unit has a fourth series circuit comprising a seventh switching element with a control connection connected to the first output and an eighth switching element with a control connection, the fourth series circuit connecting the control connection of the fourth switching element to the supply potential;

a fifth inverter is connected between the second input and the control connection of the sixth switching element; and a sixth inverter is connected between the first input and the control connection of the eighth switching element.

In accordance with an additional feature of the invention:

the first circuit unit includes a first inverting delay element and the second circuit unit includes a second inverting delay element;

the first inverting delay element connecting the first input to the control connection of the second switching element; and the second inverting delay element connecting the second input to the control connection of the fourth switching element.

In accordance with another feature of the invention, a delay unit is connected to each of the first and second outputs for producing a different delay for the two edge types of the respective output clock. In this way, it is advantageously possible to minimize the time interval during which neither of the output clock signals is at the first logic level.

In accordance with a further feature of the invention:

the delay units include first and second capacitors, respectively, with a capacitance depending on a polarity of a voltage drop across the respective capacitor;

the first output is connected via the first capacitor to the control connection of the second switching element; and the second output is connected via the second capacitor to the control connection of the fourth switching element.

In accordance with again a further feature of the invention, the delay units each include an inverter having an input connected to a corresponding one of the outputs and producing a different delay for the two edge types.

In accordance with a concomitant feature of the invention:

the first output is connected via the second switching element to the first switching element; and the second output is connected via the fourth switching element to the third switching element.

Other features which are considered as characteristic for the invention are set forth in the appended claims.

Although the invention is illustrated and described herein as embodied in an integrated circuit for producing two output clock signals at levels which do not overlap in time, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF PREFERRED EMBODIMENTS

Figure 1:
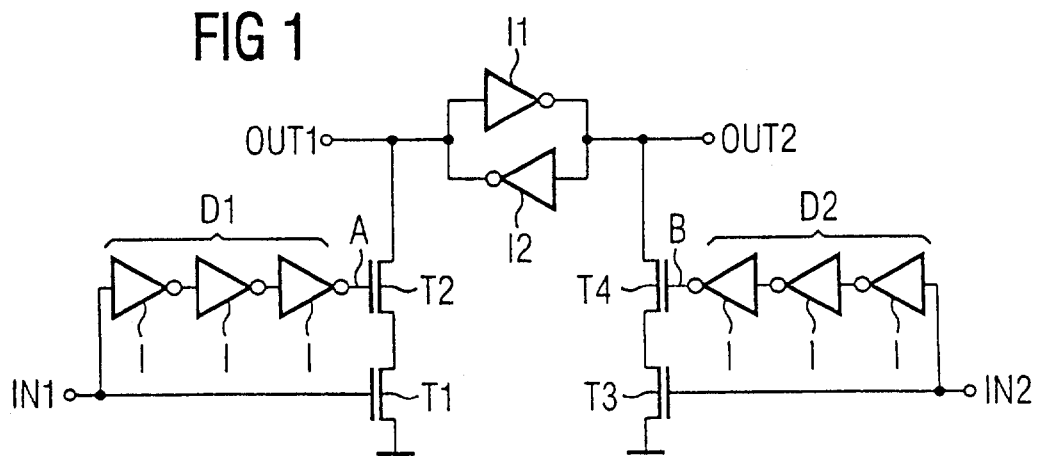
FIG. 1 is a circuit schematic of an exemplary embodiment of the integrated circuit according to the invention.

Referring now to the figures of the drawing in detail and first, particularly, to FIG. 1 thereof, there is seen a first exemplary embodiment of the integrated circuit according to the invention. The circuit has a first input IN1, a second input IN2, a first output OUT1 and a second output OUT2. The two outputs OUT1, OUT2 are connected to one another via two inverters I1, I2 that are connected back to back (anti-parallel). A low supply potential (ground) is connected via a first switching element T1 and a second switching element T2 to the first output OUT1. The ground potential is furthermore connected via a third switching element T3 and a fourth switching element T4 to the second output OUT2.

The switching elements in the exemplary embodiments described here are all n-channel transistors. The circuits can, however, just as well be produced using p-channel transistors, provided a positive supply potential is used instead of the ground potential.

The first input IN1 in the exemplary embodiment according to FIG. 1 is connected to the control connection of the first switching element T1 and, via a first inverting delay element D1, to a gate A of the second switching element T2. The second input IN2 is connected to the gate of the third switching element T3 and, via a second inverting delay element D2, to a gate B of the fourth switching element T4. The two inverting delay elements D1, D2 each have a series circuit comprising three inverters I.

Figure 4:
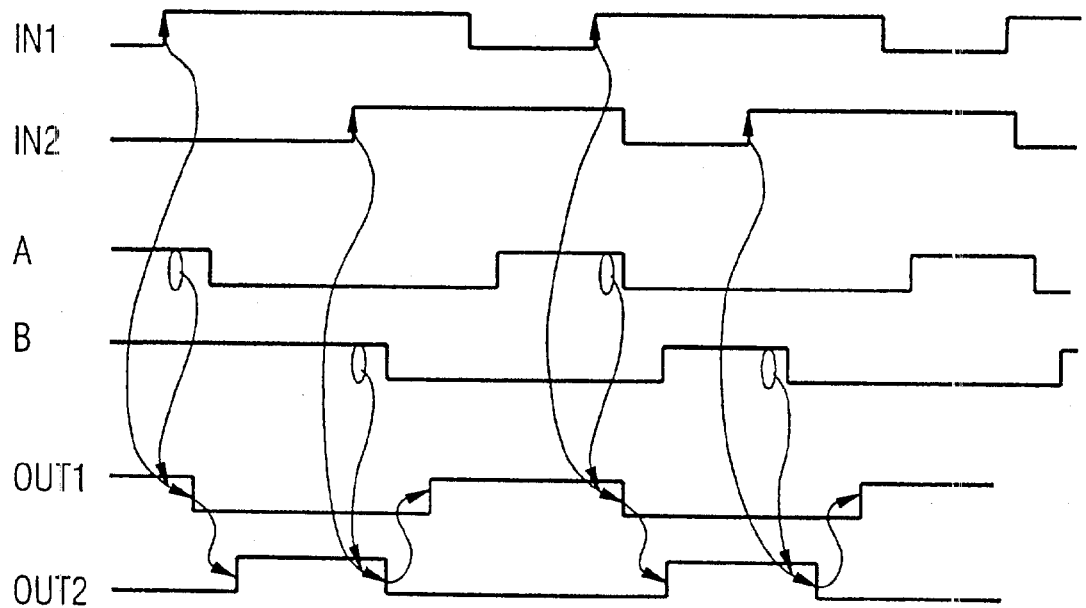
FIGS. 4 to 6 are various signal waveforms relating to the exemplary embodiments illustrated in FIGS. 1 to 3.

Referring now to FIG. 4, there are shown signal waveforms relating to the circuit illustrated in FIG. 1. The output clock signals OUT1, OUT2 are at high levels which do not overlap in time. The time periods during which neither of these clocks is at the high level are very short.

Figure 2:
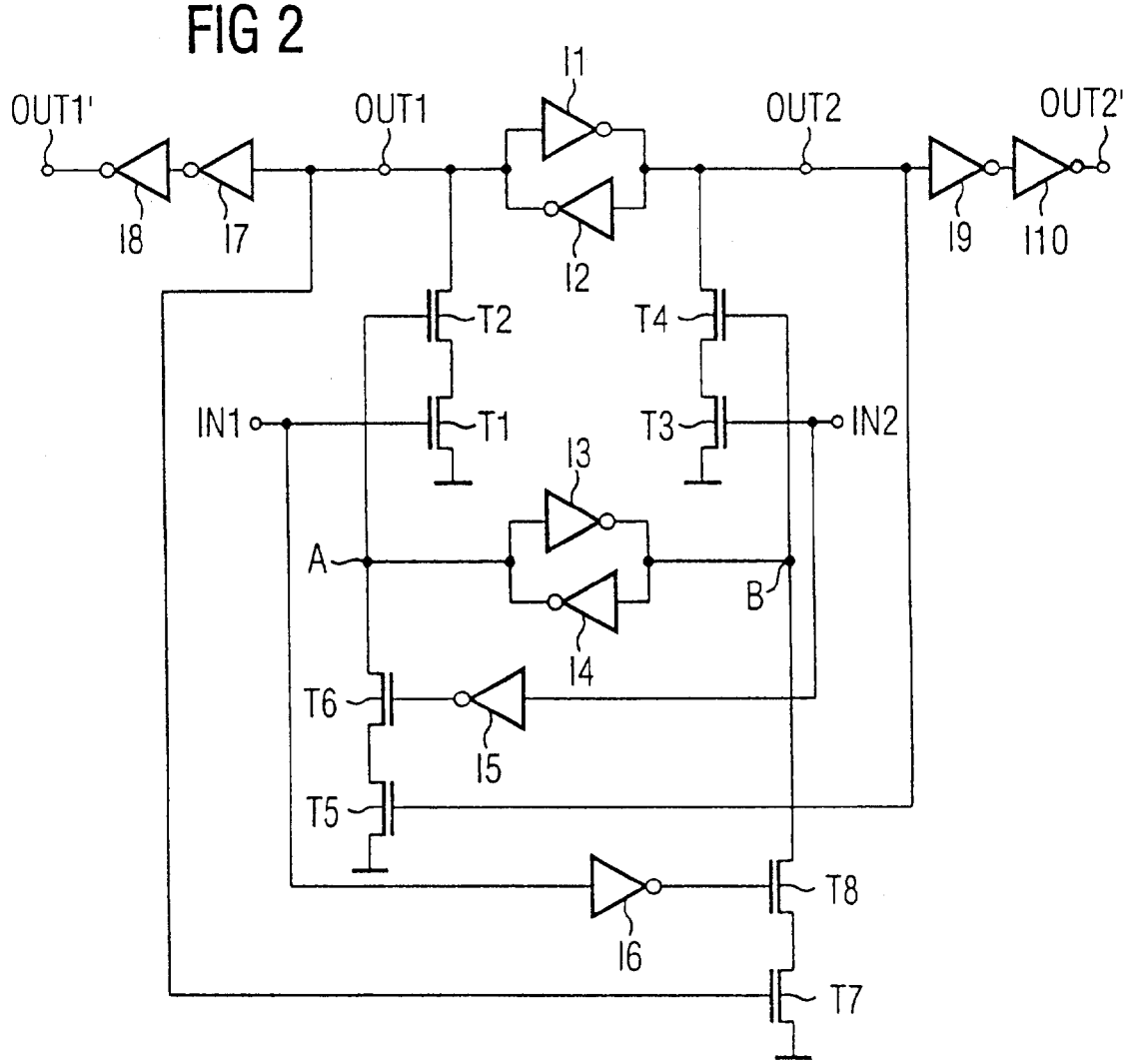
FIG. 2 is a circuit schematic of a further exemplary embodiment of the invention.

Referring now to FIG. 2, there is shown a second exemplary embodiment of the invention, which likewise has the two inverters I1, I2 between the outputs OUT1, OUT2, The series circuit comprising the second switching element T2 and the first switching element T1 is connected between the first output OUT1 and ground. The series circuit comprising the fourth switching element T4 and the third switching element T3 is connected between the second output OUT2 and ground. The first input IN1 is in turn connected to the gate of the first switching element T1, and the second input IN2 is connected to the gate of the third switching element T3. The gate A of the second switching element T2 is connected to the gate B of the fourth switching element T4 via a third inverter I3 and a fourth inverter I4, which are arranged back to back. Furthermore, the gate A of the second switching element T2 is connected via a sixth switching element T6 and a fifth switching element T5 to ground, while the gate B of the fourth switching element T4 is connected via an eighth switching element T8 and a seventh switching element T7 to ground. The first output OUT1 is connected to the gate of the seventh switching element T7, and the second output OUT2 is connected to the gate of the fifth switching element T5. The second input IN2 is connected via a fifth inverter I5 to the gate of the sixth switching element T6, and the first input IN1 is connected via a sixth inverter I6 to the gate of the eighth switching element T8.

A seventh inverter I7 and an eighth inverter I8 are connected downstream of the first output OUT1, with a modified first output clock OUT1' being produced at the output of the eighth inverter I8. A ninth inverter I9 and a tenth inverter I10 are connected downstream of the second output OUT2, with a second modified output clock OUT2' being produced at the output of the tenth inverter I10. The seventh inverter I7 and the ninth inverter I9 are designed such that they delay a negative signal edge at their input (i.e., the outputs OUT1, OUT2) to a greater extent than a positive edge. The result is that the modified output clock signals OUT1', OUT2' change level at the same time.

Figure 5:
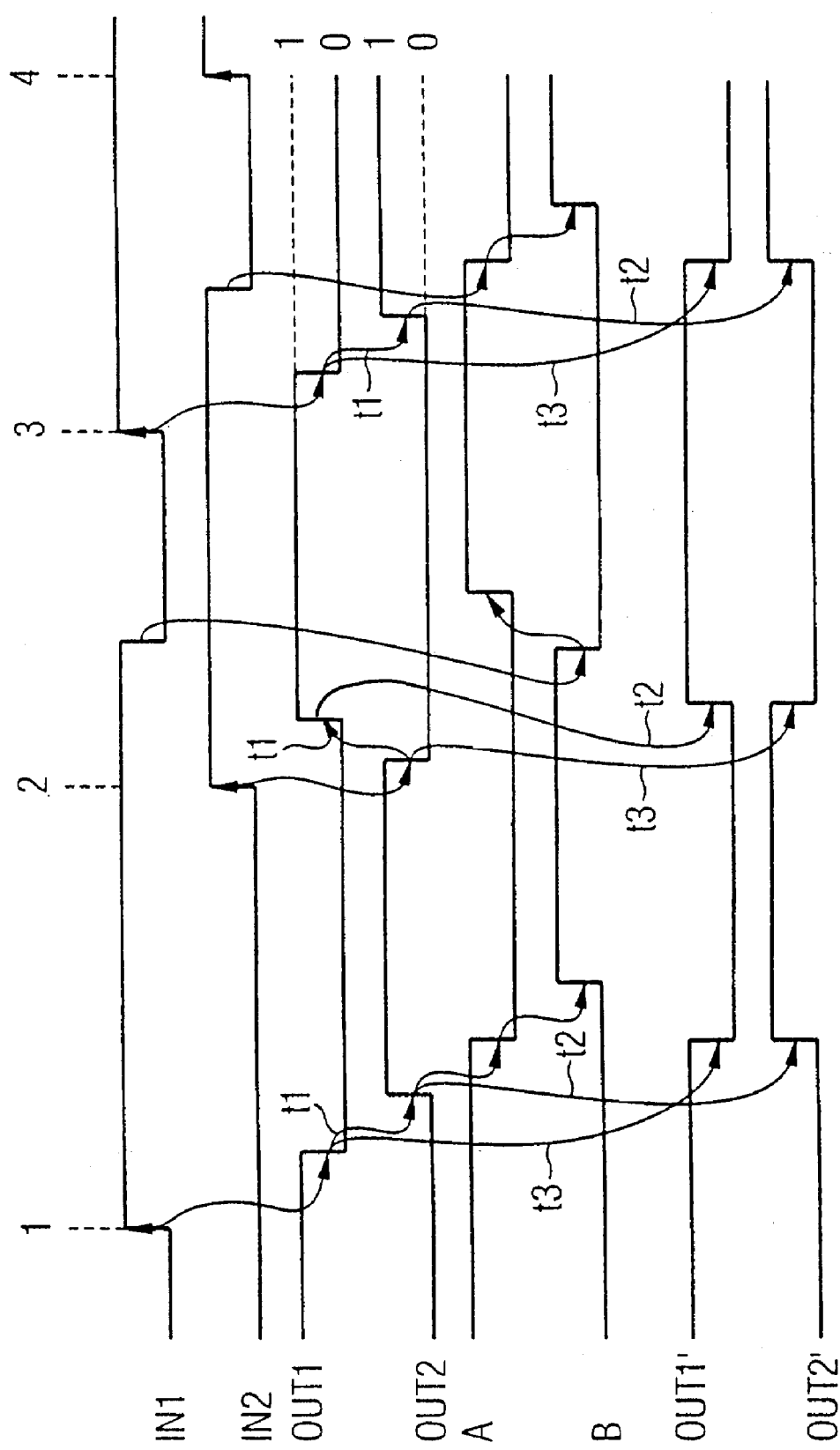

Referring now to FIG. 5, there are shown the corresponding signal waveforms relating to the exemplary embodiment of FIG. 2. FIG. 5 also shows delay times $t_1$, $t_2$, $t_3$. The first delay time $t_1$ is the delay between one edge from one of the outputs OUT1, OUT2 and one edge at the other output. The second delay time $t_2$ applies to a positive edge at the outputs OUT1, OUT2. The third delay time $t_3$ applies to a corresponding negative edge. In this case, $t_2 < t_3$. The time periods $t_2$ and $t_3$ are defined by appropriate dimensioning of the inverters I7 to I10 such that $t_1 + t_2 = t_3$. The edges of the modified output clock signals OUT1', OUT2' thus always occur at the same time.

Figure 3:
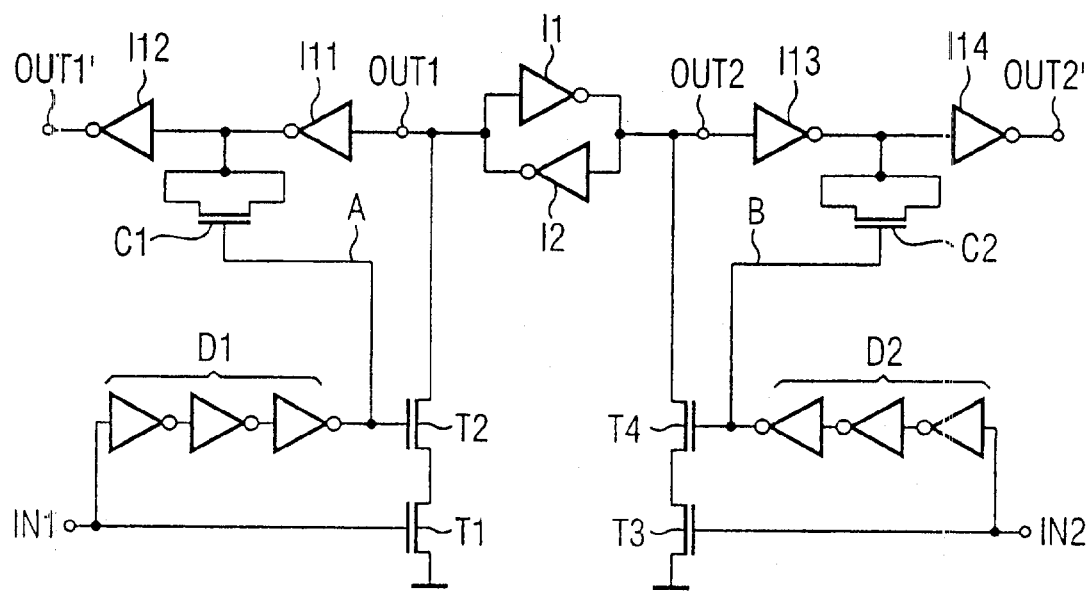
FIG. 3 is a circuit schematic of a further exemplary embodiment of the invention.

FIG. 3 shows a further exemplary embodiment of the invention, which differs from the exemplary embodiment shown in FIG. 1 in that an eleventh inverter I11 and a twelfth inverter I12 are connected downstream of the first output OUT1, with the first modified output clock OUT1' being produced at the output of the twelfth inverter I12. A thirteenth inverter I13 and a fourteenth inverter I14 are connected downstream of the second output OUT2, with the second modified output clock OUT2' being produced at the output of the fourteenth inverter I14. In this exemplary embodiment, the four inverters I11 to I14 have an at least approximately symmetrical switching behavior, that is to say they delay both positive and negative edges of their input signal by approximately the same time interval.

In order nevertheless to delay the positive edge of the output clock signals OUT1, OUT2 less than their negative edges, the output of the eleventh inverter I11 is connected via a first voltage-dependent capacitance C1 to the gate A of the second switching element T2, and the output of the thirteenth inverter I13 is connected via a second voltage-dependent capacitance C2 to the gate B of the fourth switching element T4. The voltage-dependent capacitances C1, C2 are each provided by an n-channel transistor, whose source and drain are connected to the output of the respective inverter I11, I13, and whose gates are connected to the gate A of the second switching element T2 and, respectively, to the gate B of the fourth switching element T4. When the potential at the gate of the capacitances C1, C2 is high, their value is greater than when the potential at the gate is low. This is due to the fact that, the channel of the n-channel transistor forming the respective capacitance C1, C2 is switched on when the gate potential is high, while it is switched off when the gate potential is low. This results in the effective capacitance being different in each case.

Figure 6:
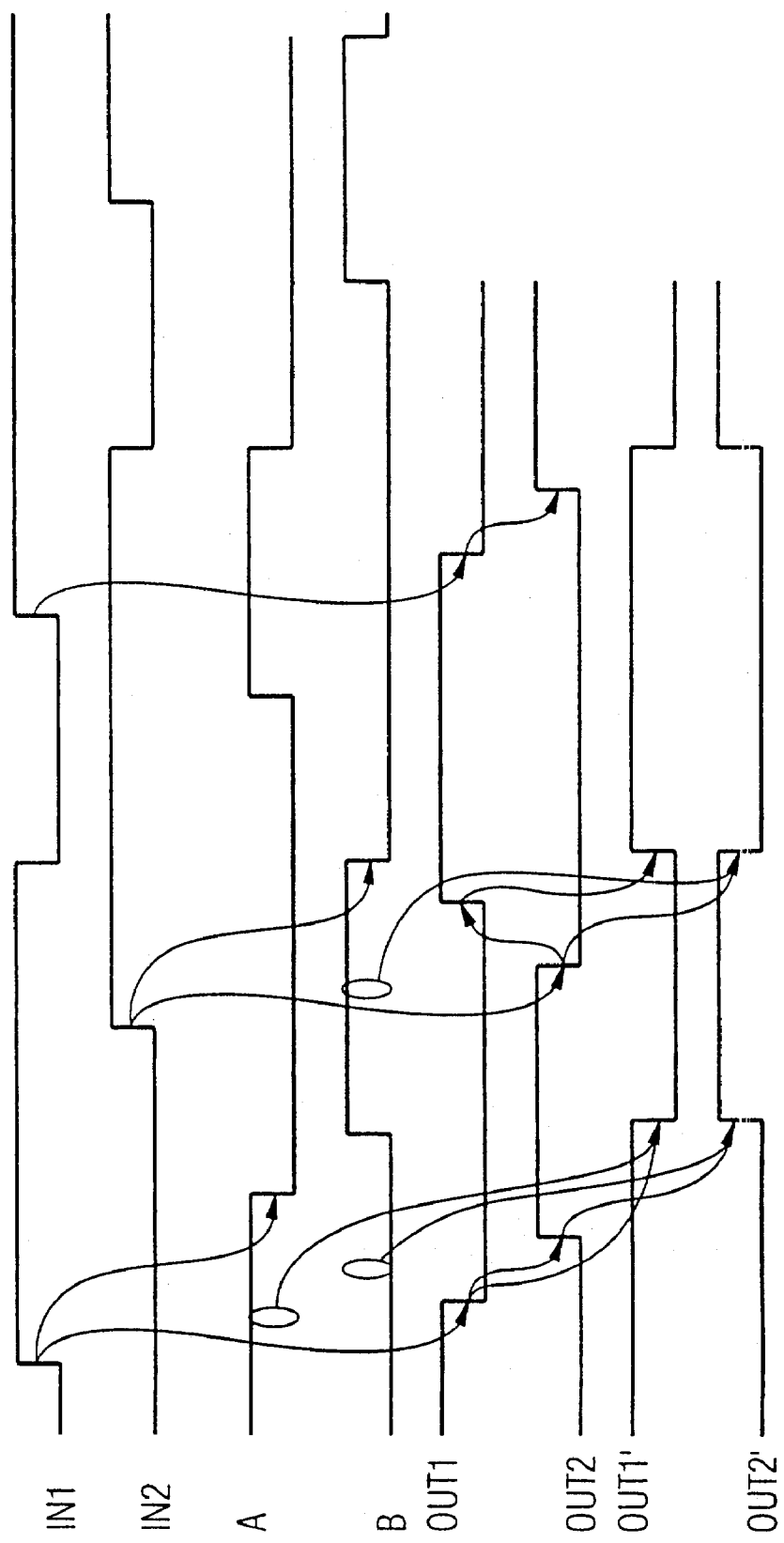

FIG. 6 shows the signal waveforms relating to the exemplary embodiment shown in FIG. 3.

In other exemplary embodiments, the modified output clock signals OUT1', OUT2 may also be produced by a seventh inverter I7 and a ninth inverter I9, as an alternative to the exemplary embodiment illustrated in FIG. 2, which inverters have a symmetrical switching behavior, when the voltage-dependent capacitances C1, C2 from the exemplary embodiment shown in FIG. 3 are provided at their outputs, and connect them to the corresponding gates A, B of the second switching element T2 and of the fourth switching element T4, respectively. In the exemplary embodiment shown in FIG. 3, it is likewise possible to omit the voltage-dependent capacitances C1, C2 and, instead of this, to design both the eleventh inverter I11 and the thirteenth inverter I13 to have an asymmetric switching behavior, as has been explained with respect to the seventh inverter I7 and the ninth inverter I9 in the exemplary embodiment shown in FIG. 2.

Further exemplary embodiments of the invention are possible, in which the sequence of the first switching element T1 and the second switching element T2 as well as the third switching element T3 and the fourth switching element T4 in the series circuits which connect the outputs OUT1, OUT2 to ground is reversed. However, it has been found that the sequence of these switching elements T1 to T4 illustrated in FIGS. 1 to 3 is advantageous.

For the function of the invention, it is important that the two input clocks at the inputs IN1, IN2 are at essentially the same frequency, although they may be at any phase angles. The integrated circuit according to the invention uses these input clocks to produce (at the outputs OUT1, OUT2) output clock signals which are likewise at the same frequency, but whose high levels do not overlap in time. For example, it is possible to produce one of the input clocks from the other, by inversion.

We claim:

1. An integrated circuit, comprising:

a first input and a second input each supplying one input clock;

a first output outputting a first output clock signal and a second output outputting a second output clock signal, the output clock signals having first logic levels that do not overlap in time;

a first and a second inverter connected back to back and between said first and second outputs;

a first series circuit comprising a first switching element having a control connection connected to said first input and a second switching element having a control connection, said first series circuit connecting said first output to a supply potential;

a second series circuit comprising a third switching element having a control connection connected to said second input and a fourth switching element having a control connection, said second series circuit connecting said second output to the supply potential;

a first circuit unit connected to said control connection of said second switching element, said first circuit unit, during an operation of the circuit, supplying said second switching element with a signal derived from the input clock supplied to said first input; and a second circuit unit connected to said control connection of said fourth switching element, said second circuit unit, during an operation of the circuit, supplying said fourth switching element with a signal derived from the input clock supplied to said second input.

2. An integrated circuit, comprising:

a first input and a second input each supplying one input clock;

a first output outputting a first output clock signal and a second output outputting a second output clock signal, the output clock signals having first logic levels that do not overlap in time;

a first and a second inverter connected back to back and between said first and second outputs;

a first series circuit comprising a first switching element having a control connection connected to said first input and a second switching element having a control connection, said first series circuit connecting said first output to a supply potential;

a second series circuit comprising a third switching element having a control connection connected to said second input and a fourth switching element having a control connection, said second series circuit connecting said second output to the supply potential;

a third and a fourth inverter connected back to back and between said control connections of said second and said fourth switching element;

a first circuit unit connected to said control connection of said second switching element, said first circuit unit, during an operation of the circuit, supplying said second switching element with a signal derived from the input clock supplied to said second input;

a second circuit unit connected to said control connection of said fourth switching element, said second circuit unit, during an operation of the circuit, supplying said fourth switching element with a signal derived from the input clock supplied to said first input;

said first circuit unit having a third series circuit comprising a fifth switching element with a control connection connected to said second output and a sixth switching element with a control connection, said third series circuit connecting said control connection of said second switching element to the supply potential;

said second circuit unit having a fourth series circuit comprising a seventh switching element with a control connection connected to said first output and an eighth switching element with a control connection, said fourth series circuit connecting said control connection of said fourth switching element to the supply potential;

a fifth inverter connected between said second input and said control connection of said sixth switching element; and a sixth inverter connected between said first input and said control connection of said eighth switching element.

3. The integrated circuit according to claim 1, wherein:

said first circuit unit includes a first inverting delay element and said second circuit unit includes a second inverting delay element;

said first inverting delay element connecting said first input to said control connection of said second switching element; and said second inverting delay element connecting said second input to said control connection of said fourth switching element.

4. The integrated circuit according to claim 1, which further comprises a delay unit connected to each of said first and second outputs for producing a different delay for the two edge types of the respective output clock signal.

5. The integrated circuit according to claim 4, wherein:

said delay units include first and second capacitors, respectively, with a capacitance depending on a polarity of a voltage drop across said respective capacitor;

said first output is connected via said first capacitor to said control connection of said second switching element; and said second output is connected via said second capacitor to said control connection of said fourth switching element.

6. The integrated circuit according to claim 4, wherein said delay units each include an inverter having an input connected to a corresponding one of said outputs and producing a different delay for the two edge types.

7. The integrated circuit according to claim 1, wherein:

said first output is connected via said second switching element to said first switching element; and said second output is connected via said fourth switching element to said third switching element.

* * * * *